(12) United States Patent
Torii

(10) Patent No.: US 6,213,847 B1
(45) Date of Patent: Apr. 10, 2001

(54) SEMICONDUCTOR WAFER POLISHING DEVICE AND POLISHING METHOD THEREOF

(75) Inventor: Koji Torii, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/311,278

(22) Filed: May 14, 1999

(30) Foreign Application Priority Data

May 20, 1998 (JP) .................................................. 10-137295

(51) Int. Cl.[7] ...................................................... B24B 49/00
(52) U.S. Cl. .................................. 451/8; 451/10; 451/57; 451/65
(58) Field of Search .................................. 451/8, 10, 57, 451/65, 262, 280

(56) References Cited

U.S. PATENT DOCUMENTS

| | | |
|---|---|---|
| 4,930,262 * | 6/1990 | Sennewald . |
| 5,439,551 | 8/1995 | Meikle et al. . |
| 5,492,594 | 2/1996 | Burke et al. . |
| 5,609,511 | 3/1997 | Moriyama et al. . |
| 5,643,050 * | 7/1997 | Chen . |
| 5,672,091 | 9/1997 | Takahashi et al. . |
| 5,816,891 * | 10/1998 | Woo . |
| 5,857,894 * | 1/1999 | Griesbach et al. . |
| 5,897,426 * | 4/1999 | Somekh . |

FOREIGN PATENT DOCUMENTS

| | | |
|---|---|---|
| 0 687 526 A1 | 12/1995 | (EP) . |
| 6-63862 | 3/1994 | (JP) . |
| 7-96456 | 4/1995 | (JP) . |
| 61-219570 | 9/1996 | (JP) . |
| 8-330259 | 12/1996 | (JP) . |
| 9-168963 | 6/1997 | (JP) . |
| 9-168969 | 6/1997 | (JP) . |
| 9-174394 | 7/1997 | (JP) . |

OTHER PUBLICATIONS

Japanese Office Action dated May 9, 2000 with partial English Translation.
British search report dated Aug. 24, 2000.

* cited by examiner

*Primary Examiner*—Timothy V. Eley
*Assistant Examiner*—Willie Berry, Jr.
(74) *Attorney, Agent, or Firm*—McGinn & Gibb, PLLC

(57) ABSTRACT

A semiconductor wafer polishing device is capable of improving controllability of a residual layer thickness and improving a production ability. The semiconductor wafer polishing device performs polishing of an interlayer insulation layer on a semiconductor wafer by performing divided polishing for the interlayer insulation layer by means of a platen, measuring a layer thickness of the interlayer insulation layer during a polishing process by the platen, and performing final polishing depending upon a result of measurement.

32 Claims, 10 Drawing Sheets

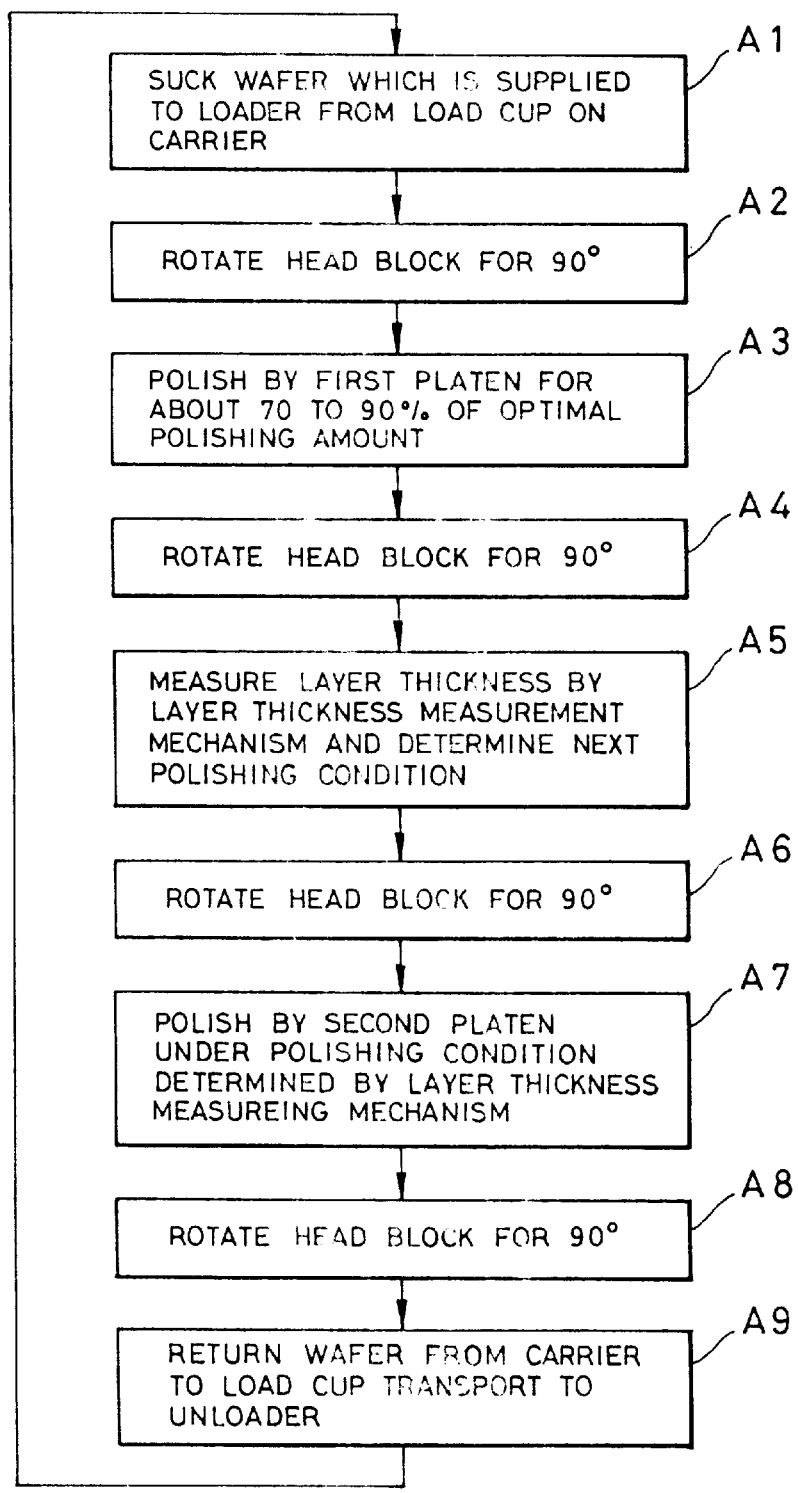

CARRIR GROUP #2

SEMICONDUCTOR WAFER POLISHING DEVICE AND POLISHING METHOD THEREOF

BACKGROUND OF THE INVENTION

1. Field of the Invention

The present invention relates generally to a semiconductor wafer polishing device and a polishing method thereof. More particularly, the invention relates to a polishing method of an interlayer insulation layer in a fabrication process of a semiconductor device.

2. Description of the Related Art

In general, when an interlayer insulation layer is deposited on an active element, such as metal oxide semiconductor (MOS) transistor or so forth, or a Al wiring after patterning thereof, uneven pattern similar to patterns of the active element, Al wiring or so forth should appear on a surface of the interlayer insulation layer. Such uneven pattern on the surface of the semiconductor can affect for precision of machining dimension in a formation process of an upper layer wiring in the semiconductor, particularly in lithographic process.

On the other hand, in the recent years, increasing of density of wiring pitch or development of multilayer wiring, it has been inherent to planarize the semiconductor substrate. For example, it has been becoming difficult to satisfy a demanded level of flatness of the surface of the interlayer insulation layer as required in the semiconductor device fabrication process by the conventional method for planarizing recessed portion of the surface of the interlayer insulation layer by fluidized coat layer, such as spion glass or the like.

Therefore, a chemical mechanical polishing (CMP) performing planarization of the surface of the interlayer insulation layer by polishing chemical mechanically is currently used.

While the chemical mechanical polishing method has higher performance than the conventional planarization method in terms of ability of planarization, the chemical mechanical polishing method is slightly low in controllability. Primary reason why the chemical mechanical polishing has lower controllability, is huge deposition amount or polishing amount.

For example, when a shape having a step (wiring) of 1 $\mu$m is planarized by the chemical mechanical polishing method with leaving an insulation layer in a thickness of 1 $\mu$m on the wiring, the insulation layer is deposited on the wiring in a thickness of 2.5 to 3 $\mu$m and then the insulation layer on the wiring is removed by chemical mechanical polishing method in the extent of 1.5 to 2 $\mu$m. For leaving the insulation layer in a thickness of 1 $\mu$m on the wiring, process steps of deposition in a thickness of 3 $\mu$m and thereafter polishing in a thickness of 2 $\mu$m have to be performed. Accordingly, influence of deposition and influence of polishing are caused in combination. Assuming that a fluctuation range in respective process steps of deposition and polishing is 10 percents, a fluctuation in the extent of 0.5 $\mu$m is caused.

On the other hand, as a reason why fluctuation factor is significant in the chemical mechanical polishing method, an abrasion pad used in the chemical mechanical polishing method is constantly subject secular change, difference of the individual polishing pad is significant, and degradation of the polishing pads can be different depending upon pattern layout on the surface of the semiconductor wafer. The significant fluctuation makes control difficult.

FIG. 8 is a longitudinal section of a basic construction of the conventional polishing device. On an upper surface of a platen 1 as a rotary body, an abrasive pad 11 is attached. Above the platen 1, a carrier 3 for holding the semiconductor wafer 15 under pressure is provided. Since the carrier 3 is directly connected to the spindle mechanism 14, it can be driven for rotation.

Accordingly, polishing is performed by setting the semiconductor wafer 15 on the carrier 3 orienting a surface to be polished by the semiconductor wafer 15 toward the abrasive pad 11. Then, the carrier 3 is lowered onto the platen 1 in rotation to apply a load to perform polishing by driving the carrier 3 to rotate in the same direction as that of the platen 1 with supplying an abrasive on the abrasive pad 11 from a nozzle 13. In practical polishing device, such basic units are constructed in various layout.

Particular example of the polishing device is shown in FIGS. 9 to 11. The polishing device shown in FIG. 9 is constructed with the platen 1, the carrier 3, a washing platen 16, a head block 2, a loader portion 6, an unloader portion 7, a loader portion 4 and a layer thickness measuring mechanism 5. One carrier 3 is provided for one platen 1 for polishing and one platen 16 for washing. This device has most basic construction.

The polishing device shown in FIG. 10 is constructed with the platen 1, the carrier 3, the head block 2, the loader 6, the unloader 7, a load cup 4, the layer thickness measuring mechanism 5, a shaft 17, and a handling arm 18. Two carriers 3a and 3b are provided for one platen 1 for polishing to slightly improve production ability.

The polishing device shown in FIG. 11 is constructed with platens 1d to 1f, the carriers 3a to 3d, the head block 2 and the load cup 4(4a). For three platens 1d to 1f for polishing, four carriers 3a to 3d are arranged with equal angular interval of 90 degrees. In this case, one semiconductor wafer can be dividingly polished between the polishing platens 1d to 1f. Also, three semiconductor wafers can be processed simultaneously in parallel to improve production ability.

Including the devices set forth above, there are various constructions of polishing devices having one or two carriers 3 for each of a plurality of platens 1 and dividing between a plurality of platens 1 by stepwise motion of the carrier 3. These polishing devices have constructions modified from the basic construction having one carrier for one platen for improving throughput.

There is unstable factor in chemical mechanical polishing method as set forth above. for example, instability occurs by the polishing device using the layer thickness measuring mechanism 5 which located in a region outside of a polishing portion of the unloader portion as a measure therefor. As such polishing devices, the devices shown in FIGS. 9 and 10 are present.

After polishing, remaining layer thickness is measured after completion of polishing by the layer thickness measuring mechanism 5 arranged in the vicinity of the unloader 7 to stop polishing when the remaining layer thickness is out of a predetermined standard range. In the alternative, if the remaining layer thickness is out of a predetermined standard range, an offset from the predetermined polishing amount is calculated from an actually measured value to reflect in a polishing period of the semiconductor wafer after measurement.

In the conventional polishing device set forth above, there is a low probability that the first pilot wafer will fall within the standard, oxide layer thickness of the semiconductor wafers without polishing measuring all wafers, followed by feedback in connection with secular change of polishing rate the feedback has a delay of one or two runs resulting in difficulty in achieving high control the oxide layer thickness after polishing.

On the other hand, when measurement for all of polished semiconductor wafer is performed with the construction improving throughput as multi-head or multi-table, a problem is encountered in that the throughput is determined by the layer thickness measuring mechanism. Accordingly, measurement of only part of the semiconductor wafer can be performed per each run.

In the nature, it is ideal to measure the residual layer thickness of the insulation layer on the semiconductor wafer within the device. However, in particularly the semiconductor wafer with pattern, it is not possible to perform polishing with measuring the residual layer thickness. Accordingly, it has been desired to achieve both of improvement of controllability of the residual layer and production ability.

SUMMARY OF THE INVENTION

Therefore, it is an object of the present invention to provide a semiconductor wafer polishing device and a polishing method thereof which can solve the problems set forth above and can improve controllability of a residual layer and improve production ability.

According to the first aspect of the present invention, a semiconductor wafer polishing device performs polishing of an interlayer insulation layer on a semiconductor wafer by performing divided polishing for the interlayer insulation layer by means of a platen, measuring a layer thickness of the interlayer insulation layer during a polishing process by the platen, and performing final polishing depending upon a result of measurement.

According to the second aspect of the present invention, a semiconductor wafer polishing device for polishing an interlayer insulation layer on a semiconductor wafer, comprises:

a platen performing polishing for the interlayer insulation layer in divided manner;

layer thickness measuring means for measuring a layer thickness of the interlayer insulation layer during an interval between polishing processes by the platen, for performing final polishing for the interlayer insulation layer depending upon a result of measurement by the layer thickness measuring means.

According to the third aspect of the present invention, a semiconductor wafer polishing method performing polishing of an interlayer insulation layer on a semiconductor wafer comprises a divided polishing step of performing divided polishing for the interlayer insulation layer by means of a platen, a layer thickness measuring step of measuring a layer thickness of the interlayer insulation layer during a polishing process by the platen, and performing final polishing depending upon a result of measurement.

Namely, the semiconductor wafer polishing device arranges a plurality of platens, on which respective abrasive pads are fitted to perform polishing between a plurality of platens in divided manner. Between a plurality of platens, layer thickness measuring mechanism for measuring the insulation layer is arranged.

In the construction set forth above, for example, after polishing in a period about 80 percents of a predicted optimal polishing amount, a residual layer thickness is measured at a predetermined position to determine a polishing period or condition of the final stage on the basis of the result of measurement. Then, polishing of the semiconductor wafer is performed with the platen different from that for primary polishing. These polishing and measurement are performed in the same device in-line.

On the other hand, with respect to an angle formed with the rotary shaft of the head block between a plurality of platens, an angle of a plurality of carriers arranged in opposition to a plurality of platens relative to the rotational shaft of the head block is set to be 1/N (N is an integer greater than or equal to 2) of the angle between a plurality of platens. Furthermore, upon performing divided polishing, even on the same platen, the polishing positions are varied to increase number of division to be greater than or equal to number of platens.

As set forth above, after polishing up to 80 percents of the predicted value of the optimal polishing amount, the final polishing condition is determined based on actual measurement. Thus, remaining polishing amount becomes about 20 percents of the overall polishing amount. Therefore, even if about 10 percents of rate fluctuation to be caused in normal polishing is present, an error becomes about 2 percents of the total polishing amount.

On the other hand, since the final polishing condition is determined on the basis of the residual layer thickness, fluctuation of deposition amount can be accommodated. Furthermore, necessary polishing amount of the semiconductor wafer with the pattern is different depending upon the pattern, by using the layer thickness measuring mechanism adapted for semiconductor wafer with the pattern by image recognition, it becomes possible to adapt to difference of the necessary polishing amount. Therefore, pilot polishing conventionally required per every new mask becomes unnecessary to determine the condition during a series of polishing operation. Therefore, controllability of the residual layer can be improved significantly.

Furthermore, these polishing, measurement and polishing are performed sequentially within the same device in in-line manner, re-polishing becomes unnecessary to improve production efficiency. In contrast to this, when re-polishing is performed using different polishing device, period required for handling in washing, layer thickness measurement and polishing overlap to lower production efficiency.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings:

FIGS. 3A and 3B are flowchart showing polishing operation in the first embodiment of the semiconductor wafer polishing device according to the present invention;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
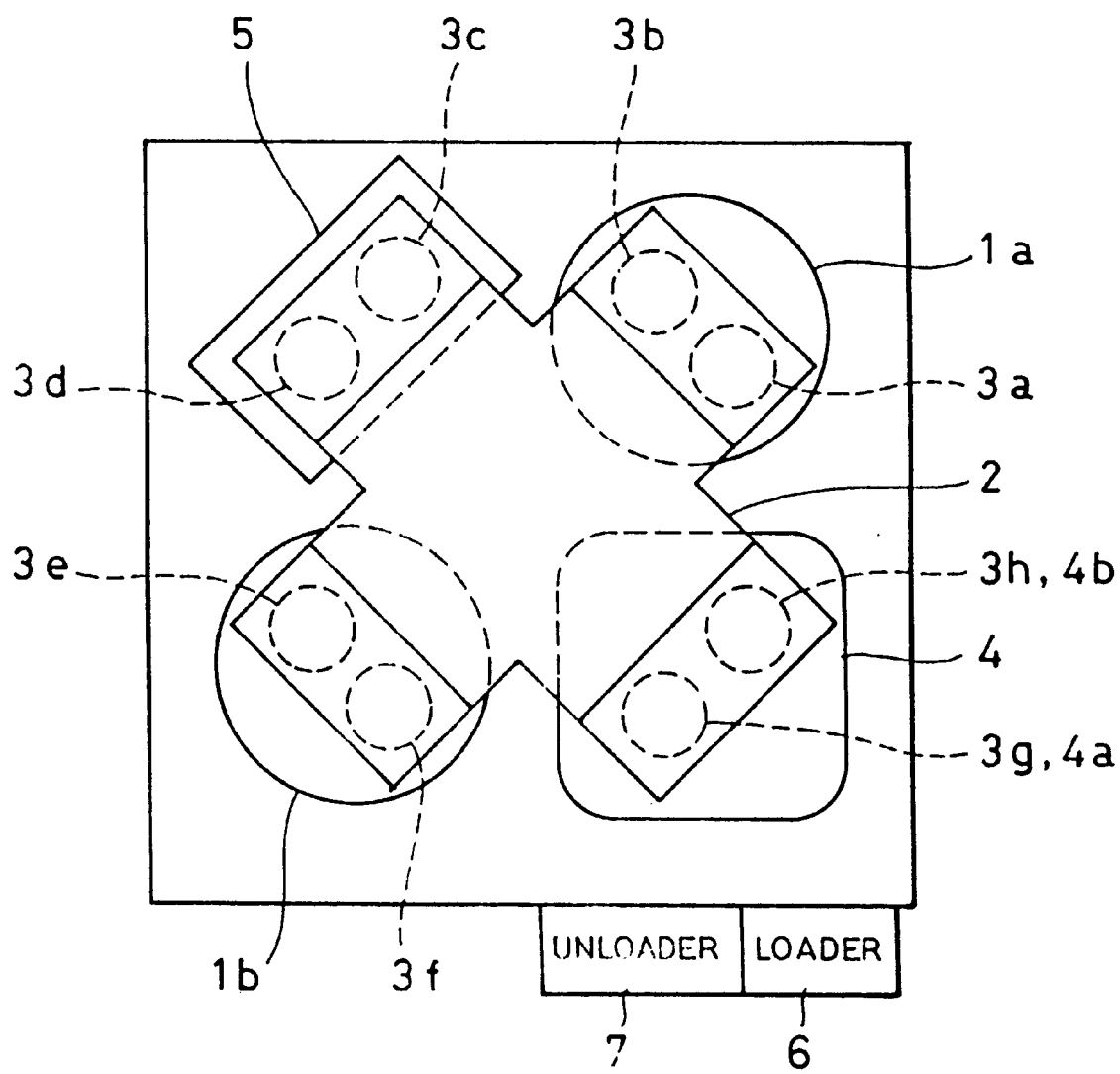
FIG. 1 is a plan view showing a construction of the first embodiment of a semiconductor wafer polishing device according to the present invention.

FIG. 1 is a plan view showing a construction of the first embodiment of a semiconductor wafer polishing device according to the present invention. In FIG. 1, the first embodiment of the semiconductor wafer polishing device according to the present invention is constructed with platens 1a and 1b, a head block 2, carriers 3a to 3h, load cups 4 (4a and 4b), a layer thickness measuring mechanism 5, a loader portion 6 and an unloader portion 7.

In the first embodiment of the semiconductor wafer polishing device according to the present invention, respective two parallel carriers 3a to 3h are arranged in four directions (with angular interval of 90 degrees). The carriers 3a to 3h are rotatable in horizontal direction according to rotation of the head block 2. Since polishing can be performed by four carriers even during measurement, loading or unloading, number of the semiconductor wafers (not shown) to be processed can be increased. On the other hand, as the layer thickness measuring mechanism, an optical type adapted for a semiconductor wafer with a pattern by image recognition is employed.

Figure 2A:
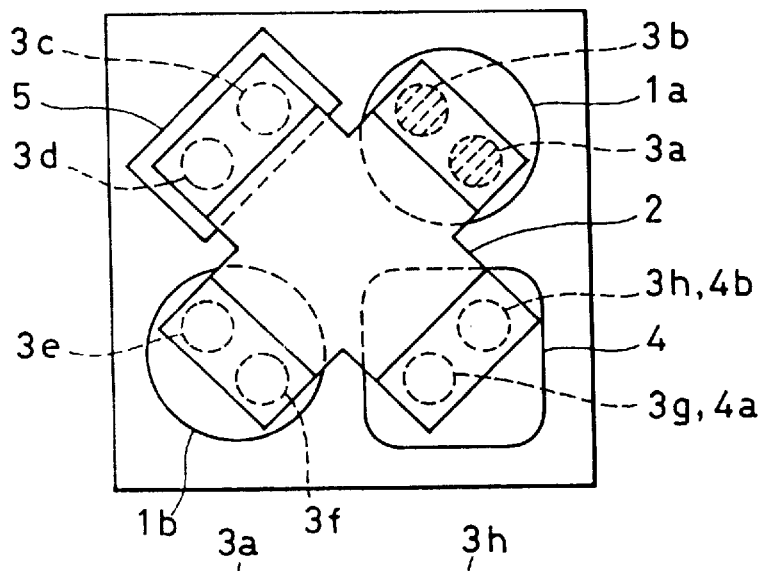
FIGS. 2A to 2C are illustrations showing polishing of the first embodiment of the semiconductor wafer polishing device according to the present invention.
Figure 2B:
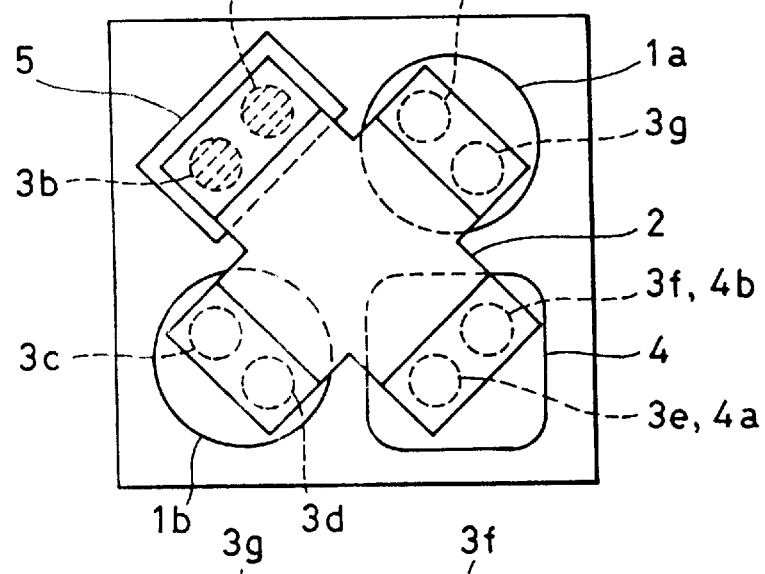
Figure 2C:
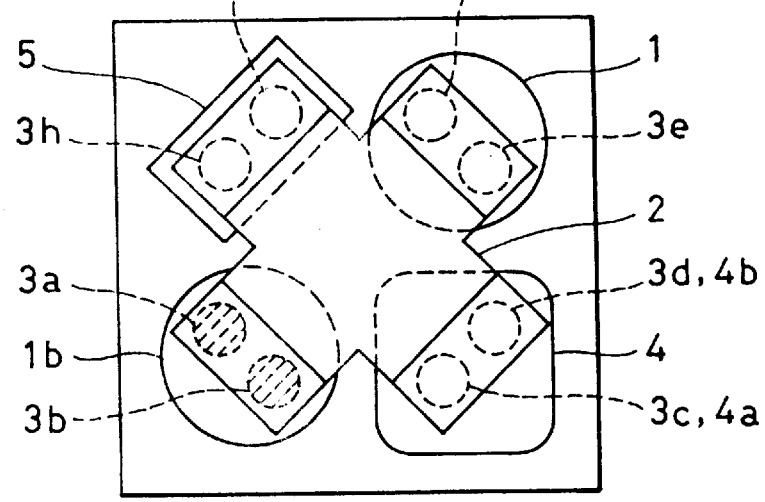
Figure 3B:
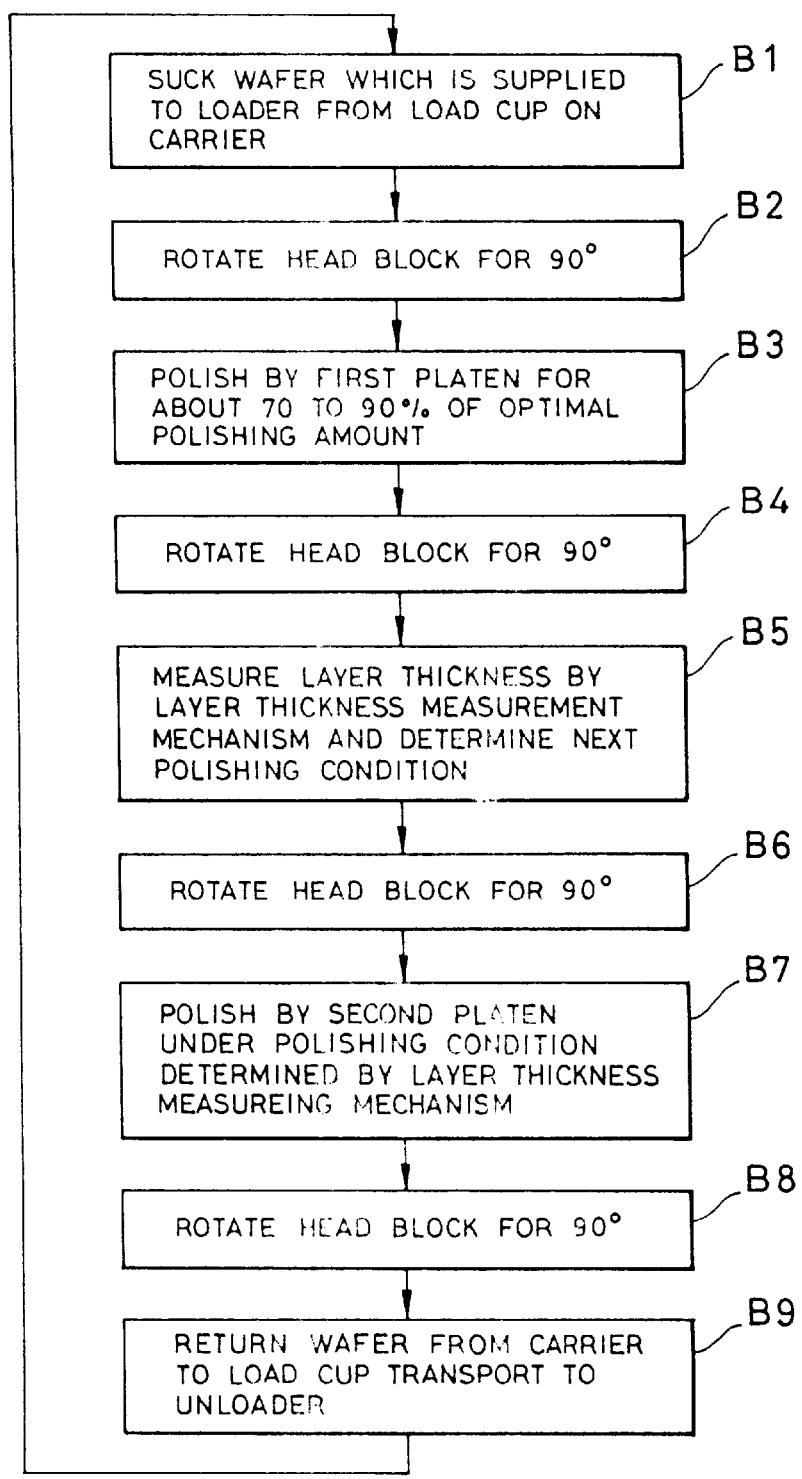

FIGS. 2A to 2C are illustrations showing polishing operation of the first embodiment of the semiconductor wafer polishing device according to the present invention. In FIGS. 2A to 2C, dividing operation of polishing of the semiconductor wafer is shown. FIGS. 3A and 3B are flowcharts showing polishing operation of the first embodiment of the semiconductor wafer polishing device according to the present invention. Here, the carriers 3a to 3h are grouped into carrier groups #1 to #4 per two.

From the loader portion 6, two semiconductor wafers are supplied to the load cups 4a to 4b. The semiconductor wafers supplied to the load cups 4a and 4b are sucked on the carriers 3a and 3b (see A1 of FIG. 3A), thereafter, overall head block 2 is rotated for 90 degrees in counterclockwise direction (see A2 of FIG. 3A) to position on the platen 1a (see FIG. 2A). It should benoted that all rotating direction of the head block 2 is counterclockwise direction and discussion will be given for polishing process of the semiconductor wafer sucked on the carriers 3a and 3b as illustrated with hatching. It should be further noted that, unless otherwise indicated, the rotating direction of the head block is in counterclockwise direction.

At first, for the semiconductor wafer sucked by the carriers 3a and 3b, first polishing is performed by the platen 1a. A polishing amount of the semiconductor wafer by the platen 1a, is set at 70 to 90 percents of a polishing amount predicted as an optimal polishing amount (see A3 of FIG. 3A).

Next, the overall head block is rotated for 90 degrees (see A4 of FIG. 3A) to place the semiconductor wafer sucked on the carriers 3a and 3b on the layer thickness measuring mechanism 5, the layer thickness of respective predetermined positions of the semiconductor wafer are measured by the layer thickness measuring mechanism 5 (see FIG. 2B; see A5 of FIG. 3A).

Subsequently, the overall head block is rotated for 90 degrees (see A6 of FIG. 3A) to place the semiconductor wafer sucked on the carriers 3a and 3b on the platen 1b to perform polishing under the polishing condition by comparing a target value of the residual layer of the semiconductor wafer sucked on the carriers 3a and 3b and the actually measured value (see FIG. 2C; see A7 of FIG. 3A). In the actually measured layer thickness, polishing is unnecessary. In such case, polishing is not necessary to perform.

A polishing period in the second stage is determined by the following expression.

polishing period =(target value of residual layer−measured value)/ polishing rate of blank wafer (oxide layer)

As the polishing rate of the blank wafer, a preliminarily measured numerical value may be used. If the polishing amount reaches 70 to 80 percents of the overall polishing amount, the surface of the semiconductor wafer becomes substantially flat. Therefore, the subsequent polishing rate becomes substantially equal to the polishing rate of the blank wafer.

On the other hand, if extremely offset from setting of the estimated polishing amount in the first stage, namely from the range from 70 to 90 percents relative to the overall polishing amount, the polishing rate may be appropriately varied from a tendency of initial several semiconductor wafers.

Finally, overall head block 2 is further rotated for 90 degrees (see A8 of FIG. 3A), the semiconductor wafers sucked on the carriers 3a and 3b are returned to the load cups 4a and 4b to transport to the unloader portion 7 (see A9 of FIG. 3A). Subsequently, the process returns to step A1. Then, the next semiconductor wafers are supplied to the load cups 4a and 4b.

The foregoing flowchart is established in consideration of the polishing process in a pair of carriers 3a and 3b shown by particular hatching. Concerning other carriers 3c to 3h, operation in respective positions of the load cups 4a and 4b, platens 1a and 1b and the layer thickness measuring mechanism 5 may be performed simultaneously. Namely, in parallel to the processes of A1 to A9 as set forth above, processes of B1 to B9, C1 to C9 and D1 to D9 by the carriers 3c to 3h (processes C1 to C9 and D1 to D9 are not shown in FIG. 3B) are executed.

In this case, suction of the semiconductor wafer to the carriers 3a to 3h, polishing by the platens 1a and 1b, measurement of the layer thickness by the later thickness measuring mechanism 5 are performed per carrier group #1 to #4 as shown in FIGS. 3A and 3B.

Figure 4A:
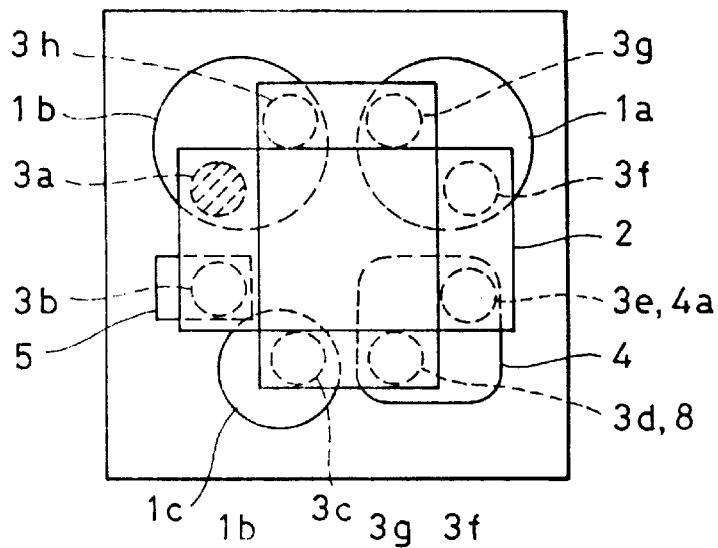
FIGS. 4A to 4C are illustrations showing polishing of the second embodiment of the semiconductor wafer polishing device according to the present invention.
Figure 4B:
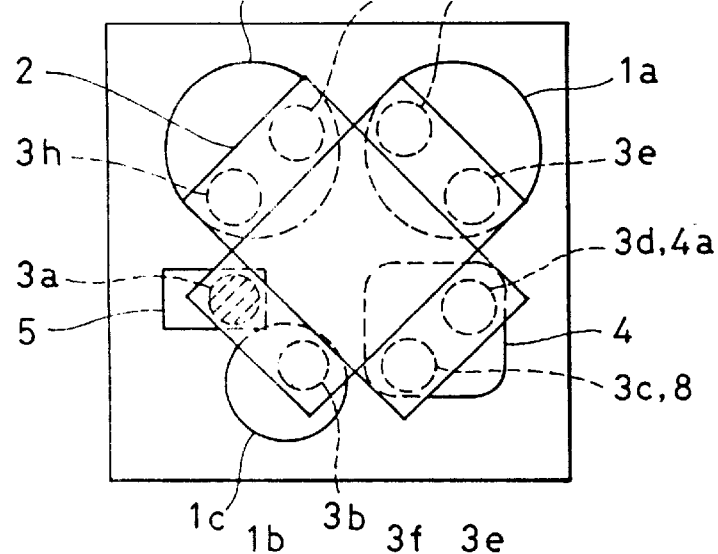
Figure 4C:
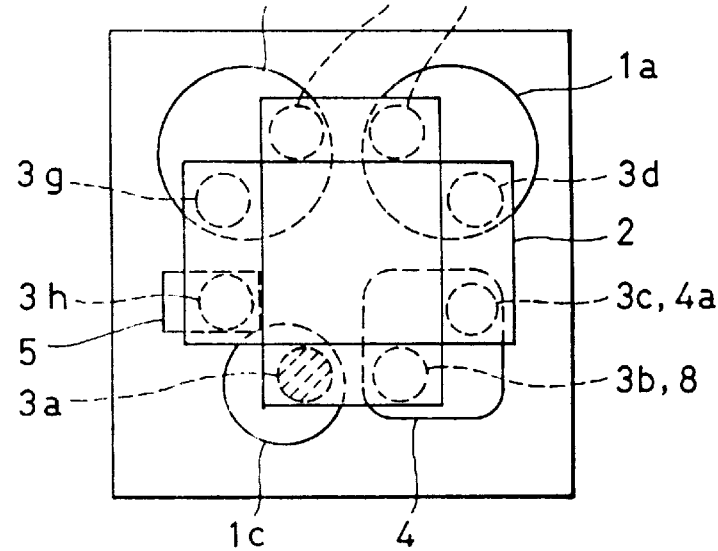

FIGS. 4A to 4C are illustration showing polishing operation of the second embodiment of the semiconductor wafer polishing device in accordance with the present invention. In FIGS. 4A to 4C, the second embodiment of the semiconductor wafer polishing device is constructed with platens 1a to 1c, the head block 2, the carriers 3a to 3h, the load cup 4 (4a), the layer thickness measuring mechanism 5 and an unloader cup 8. On the other hand, while not illustrated in the drawings, the second embodiment of the semiconductor wafer polishing device according to the invention also includes the loader portion 6 and the unloader portion 7 similarly to the first embodiment of the present invention.

In the second embodiment of the semiconductor wafer polishing device according to the present invention, three platens 1a to 1c, the layer thickness measuring mechanism 5 which can measure layer thickness of one semiconductor wafer, the carriers 3a to 3h paired per two are arranged in four directions with a regular interval of 90 degrees from a rotational shaft of the head block 2. On other hand, the carriers 3a to 3h are arranged radially about the rotational shaft of the head block 2 with a regular interval of 45 degrees.

The second embodiment of the semiconductor wafer polishing device according to the present invention is differentiated from the first embodiment of the semiconductor wafer polishing device of the invention in arrangement of the platens 1a to 1c and the layer thickness measuring mechanism 5. Namely, the primary first and second polishing platens 1a and 1b can simultaneously polish two semiconductor wafers sucked on two carriers. The third platen 1c for final polishing can perform polishing only one semiconductor wafer sucked on the carrier. Adjacent the third platen 1c, the layer thickness measuring mechanism 5 is arranged.

The second embodiment of the semiconductor wafer polishing device according to the present invention is differentiated from the first embodiment of the semiconductor wafer polishing device of the invention is that the head block is driven to rotate at 45 degrees step. Namely, after performing primary polishing with dividing into four by the first platen 1a and the second platen 1b, the residual layer thickness at the predetermined position of the semiconductor wafer is measured by the layer thickness measuring mechanism 5. Then, the final polishing is performed by the third platen 1c for a polishing period determined by the residual layer thickness at the predetermined position of the semiconductor wafer and the preliminarily determined set value.

Figure 5A:
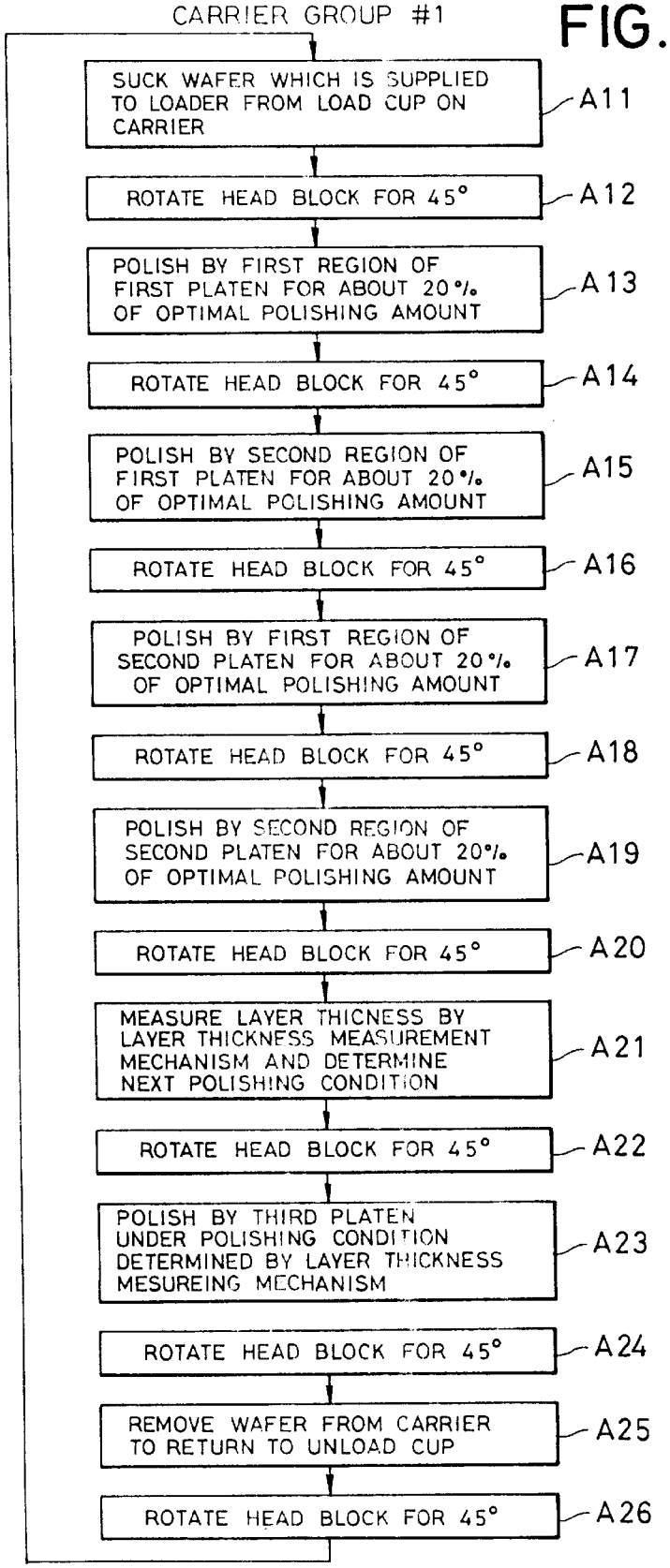
FIGS. 5A and 5B are flowchart showing polishing operation in the second embodiment of the semiconductor wafer polishing device according to the present invention.
Figure 5B:
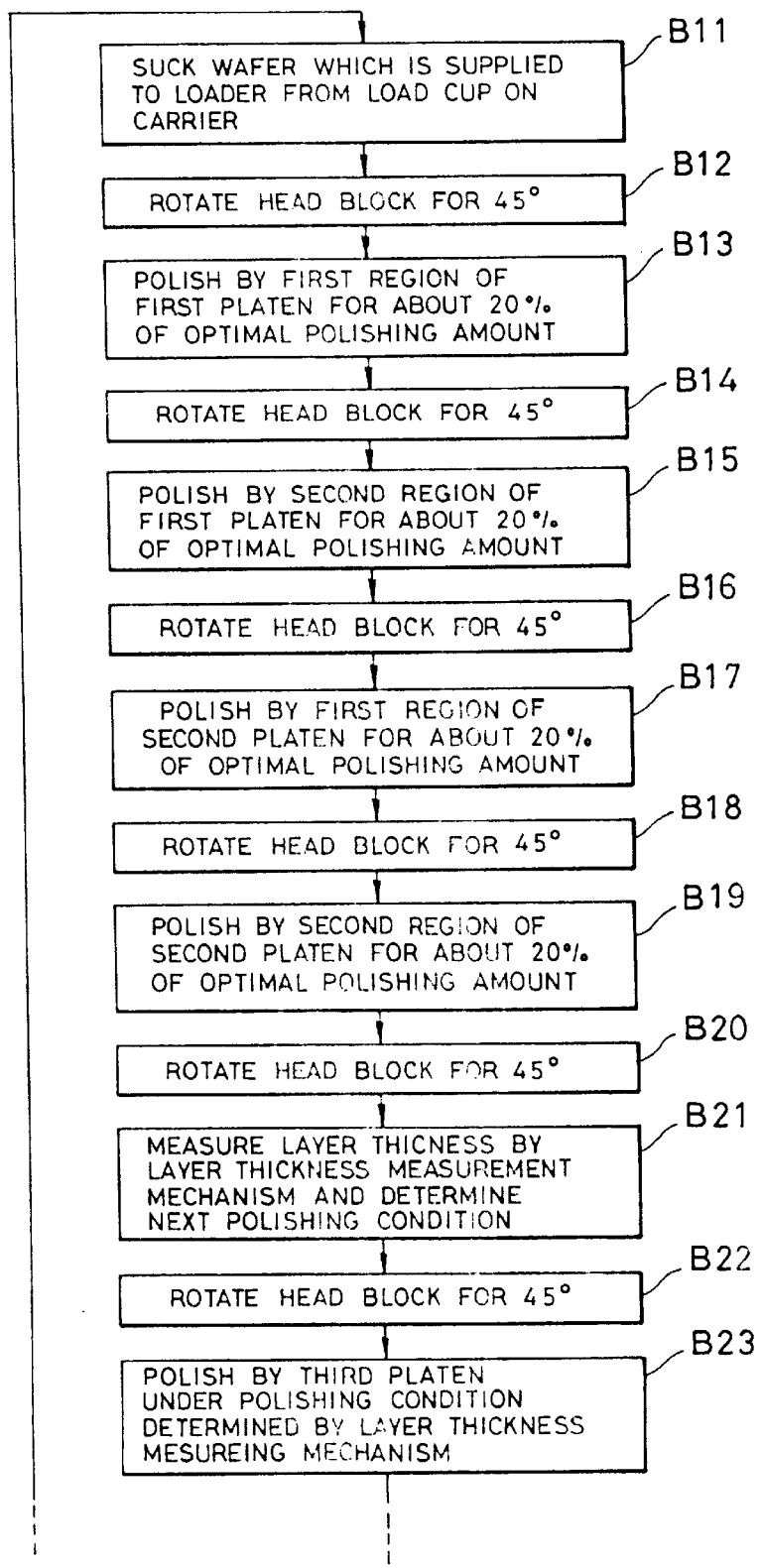

FIGS. 5A and 5B are flowchart showing polishing operation of the second embodiment of the semiconductor wafer polishing device according to the present invention. The polishing operation of the second embodiment of the semiconductor wafer polishing device according to the present invention will be discussed with reference to FIGS. 4A to 4C, 5A and 5B.

At first, the semiconductor wafer is supplied from the loader portion 6 to the load cup 4a. The semiconductor wafer supplied to the load cup 4a is sucked on the carrier 3a (see A11 of FIG. 5A). Then, by rotating the overall head block 2 for 45 degrees in counterclockwise direction (see A12 of FIG. 5A), the semiconductor wafer is positioned on the first region of the platen 1a.

For the semiconductor wafer sucked on the carrier 3a, first polishing is performed on the first region of the first platen 1a (see A13 of FIG. 5A). The polishing amount for the semiconductor wafer is in an extent of 20 percents of the polishing amount predicted as an optimal polishing amount. Hereinafter, from the first polishing to the fourth polishing, polishing for the semiconductor wafer is performed in the same polishing amount (about 20 percents of the polishing amount of the polishing amount predicted as optimal polishing amount).

Subsequently, by rotating the overall head block 2 for 45 degrees (see A14 of FIG. 5A), the semiconductor wafer sucked on the carrier 3a is positioned on the second region of the first platen 1a to perform second polishing on the second region of the first platen 1a for the semiconductor wafer sucked on the carrier 3a (see A15 of FIG. 5A).

Thereafter, by further rotating the overall head block 2 for 45 degrees (see A16 of FIG. 5A), the semiconductor wafer sucked on the carrier 3a is positioned on the first region of the second platen 1b to perform third polishing on the first region of the second platen 1b (see A17 of FIG. 5A).

Furthermore, by rotating the overall head block 2 for 45 degrees (see A18 of FIG. 5A), the semiconductor wafer sucked on the carrier 3a is positioned on the second region of the second platen 1b to perform fourth polish on the second region of the second platen 1b (see A19 of FIG. 5A).

After the fourth polishing, the overall head block 2 is rotated for 45 degrees (see A20 of FIG. 5A). The semiconductor wafer sucked on the carrier 3a is positioned on the layer thickness measuring mechanism 5. In the layer thickness measuring mechanism 5, the layer thickness at the predetermined position of the semiconductor wafer sucked on the carrier 3a is measured (see FIG. 4B: see A21 of FIG. 5A).

Next, by rotating the overall head block 2 for 45 degrees, the semiconductor wafer sucked on the carrier 3a is positioned on the third platen 1c to perform final polishing for the semiconductor wafer sucked on the carrier 3a under a polishing condition determined on the basis of a result of comparison between an actually measured value by the layer thickness measuring mechanism 3 and a target value of the residual layer thickness of the semiconductor wafer sucked on the carrier 3a (see FIG. 4C; see A23 of FIG. 5A).

Subsequently, by rotating the overall head block 2 for 45 degrees (see A24 of FIG. 5A), the semiconductor wafer sucked on the carrier 3a is positioned on the unloading cup 8 to return the semiconductor wafer to the unload cup 8 (see A25 of FIG. 5A). Thereafter, by rotating the overall head block 2 for 45 degrees (see A26 of FIG. 5A), the carrier 3a is positioned on the load cup 4a.

Advantage of the second embodiment of the semiconductor wafer according to the present invention is superior production ability. In the first embodiment of the semiconductor wafer polishing device according to the present invention, polishing in the extent of about 80 percents of the overall polishing amount is performed by the first platen, and remaining about 20 percents of polishing is performed by the second platen 1b. In order to improve precision in controlling the residual layer thickness, it becomes necessary to reduce polishing amount in the final polishing as least as possible. However, if the polishing amount in the final polishing, efficiency becomes low. In this case, throughput of the polishing device is determined by the polishing period in the polishing by the first platen 1a. For example, when the overall polishing period is five minutes, polishing is performed for four minutes by the first platen 1a. Therefore, in such case, the semiconductor wafer can be processed at four minutes interval.

In contrast to this, in the second embodiment of the semiconductor wafer polishing device according to the present invention, polishing is performed with dividing into four by operating the overall head block 2 for rotation at a step of 45 degrees and with distributing to the first and second regions of the first platen 1a and the first ands second regions of the second platen 1b. Therefore, polishing of the semiconductor wafer is progressed at one minutes interval. On the other hand, while the first embodiment of the present invention simultaneously process two semiconductor wafers with two carrier construction, the second embodiment of the invention performs process for one semiconductor wafer, production ability can be improved to be substantially double.

The foregoing flowchart is established in consideration of the polishing process on the carrier 3a illustrated by particular hatching. Concerning other carriers 3b to 3h operations at respective positions (the load cup 4a,the platens 1a to 1c and the layer thickness measuring mechanism 5) may be performed simultaneously. Namely, process of B11 to B26, C11 to C26, D11 to D26, E11 to E26, F11 to F26, G11 to G26 and H11 to H26 are executed by other carriers 3b to 3h (processes of B24 to B26, C11 to C26, D11 to D26, E11 to E26, F11 to F26, G11 to G26 and H11 to H26 are not illustrated in FIG. 5B).

In this case, suction of the semiconductor wafers onto the carriers 3a to 3h, polishing by the platens 1a to 1c, measurement of the layer thickness by the layer thickness measuring mechanism 5 are performed per each carrier #1 to #8 as shown in FIGS. 5B and 5C.

Figure 6:
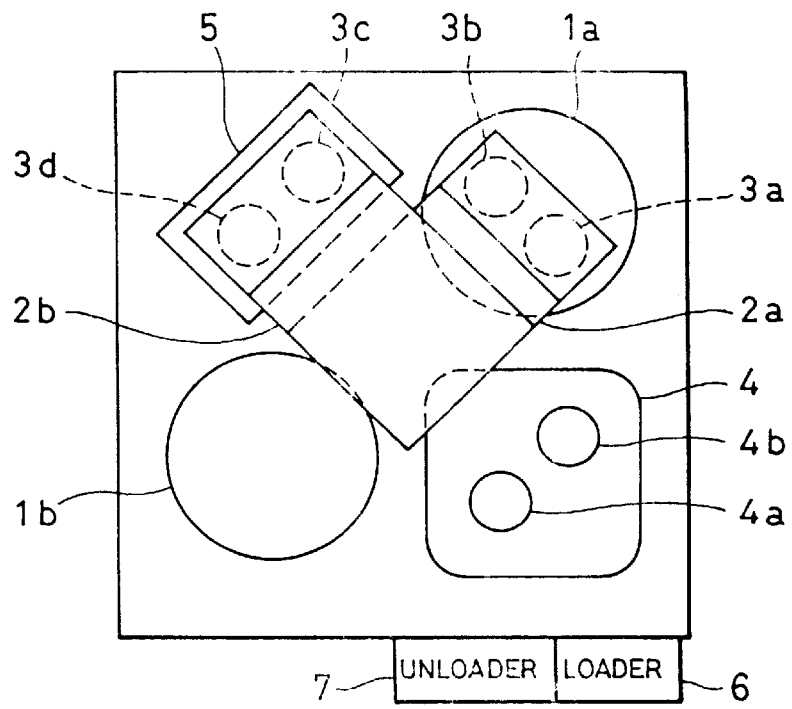
FIG. 6 is a plan view showing a construction of the third embodiment of a semiconductor wafer polishing device according to the present invention.

FIG. 6 is a plan view showing the construction of the third embodiment of the semiconductor wafer polishing device according to the present invention. In FIG. 6, the third embodiment of the semiconductor wafer polishing device according to the present invention is constructed with the platens 1a and 1b, head blocks 2a and 2b, carriers 3a to 3d, the load cups 4 (4a and 4b), the layer thickness measuring mechanism 5, the loader portion 6 and the unloader portion 7.

Here, the third embodiment of the semiconductor wafer polishing device according to the present invention is differentiated from other embodiment in that head blocks 2a and 2b respectively having respective two carries 3a to 3d arranged in parallel are rotatable independently of the other.

In this case, the third embodiment of the semiconductor wafer polishing device according to the present invention performs similar operation to the first embodiment of the present invention shown in FIG. 1. After performing measurement of the layer thickness by the layer thickness measuring mechanism 5, re-polishing is performed by returning to the platen 1a.

On the other hand, while polishing by the platen 1a is performed for the semiconductor wafers sucked on the carriers 3a and 3b of the head block 2a, measurement of the layer thickness by the later thickness measuring mechanism 5 and polishing by the platen 1b are performed for the semiconductor wafers sucked on the carriers 3c and 3d of the head block 2b are performed. Accordingly, the third embodiment of the semiconductor wafer polishing device according to the present invention has greater freedom in setting of flow of polishing or so forth in comparison with other embodiments.

Figure 7:
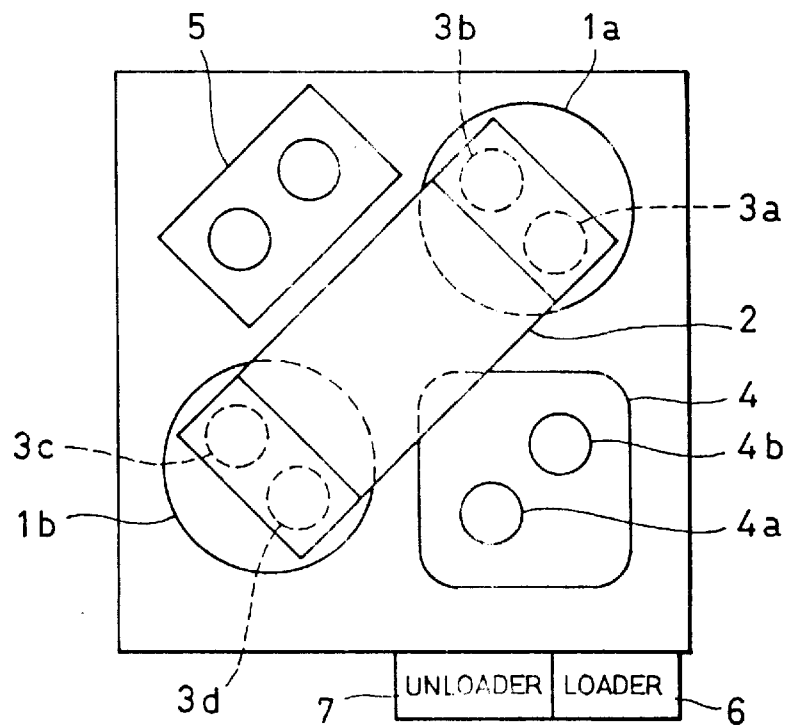
FIG. 7 is a plan view showing a construction of the fourth embodiment of a semiconductor wafer polishing device according to the present invention.
Figure 8:
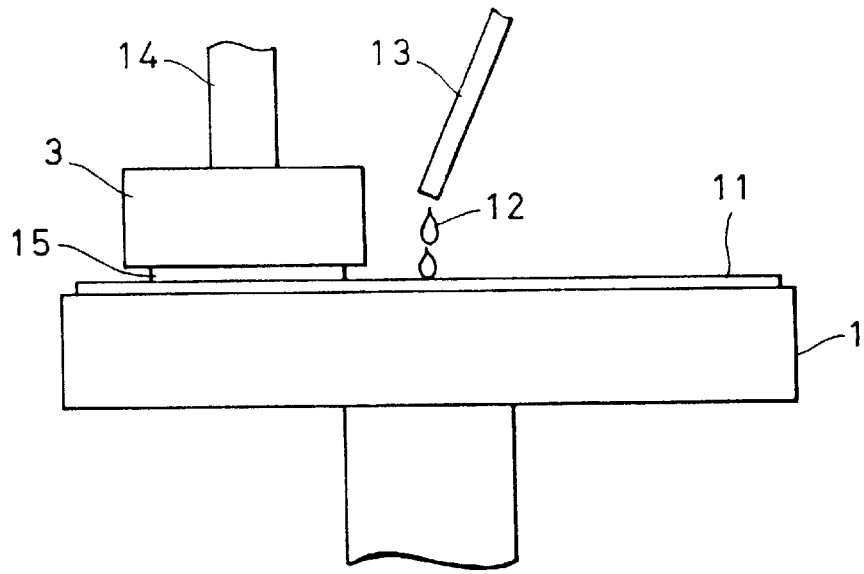
FIG. 8 is a longitudinal section showing one example of construction of the conventional semiconductor wafer polishing device.
Figure 9:
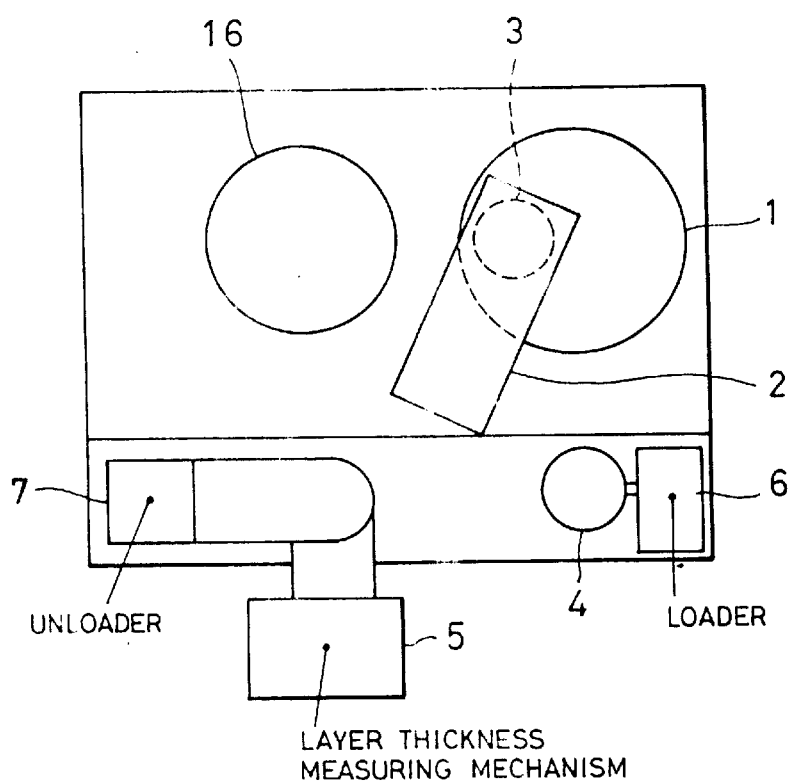
FIG. 9 is a plan view showing another example of construction of the conventional semiconductor wafer polishing device.
Figure 10:
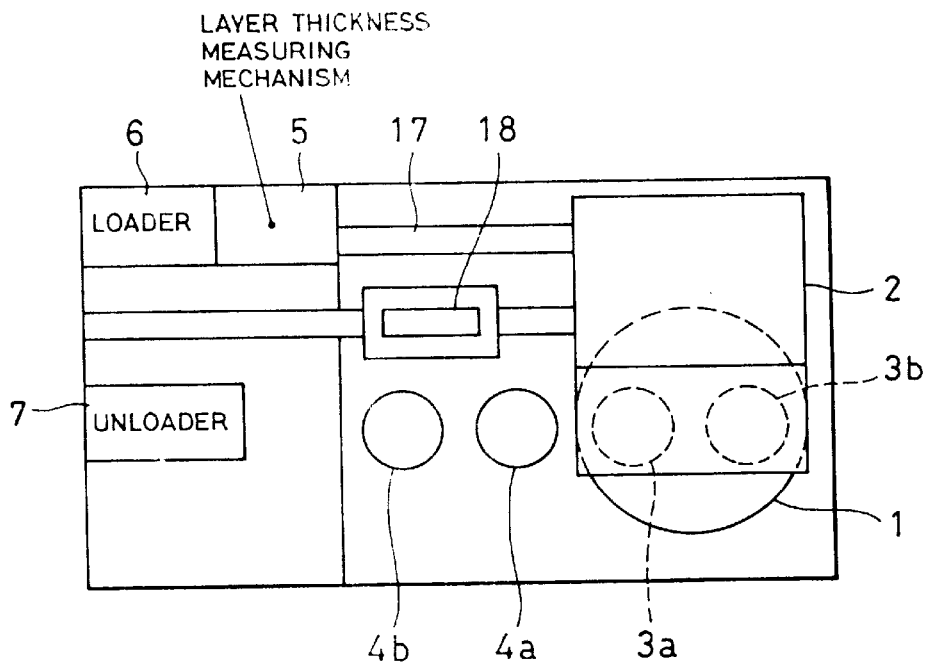
FIG. 10 is a plan view showing a further example of construction of the conventional semiconductor wafer polishing device.
Figure 11:
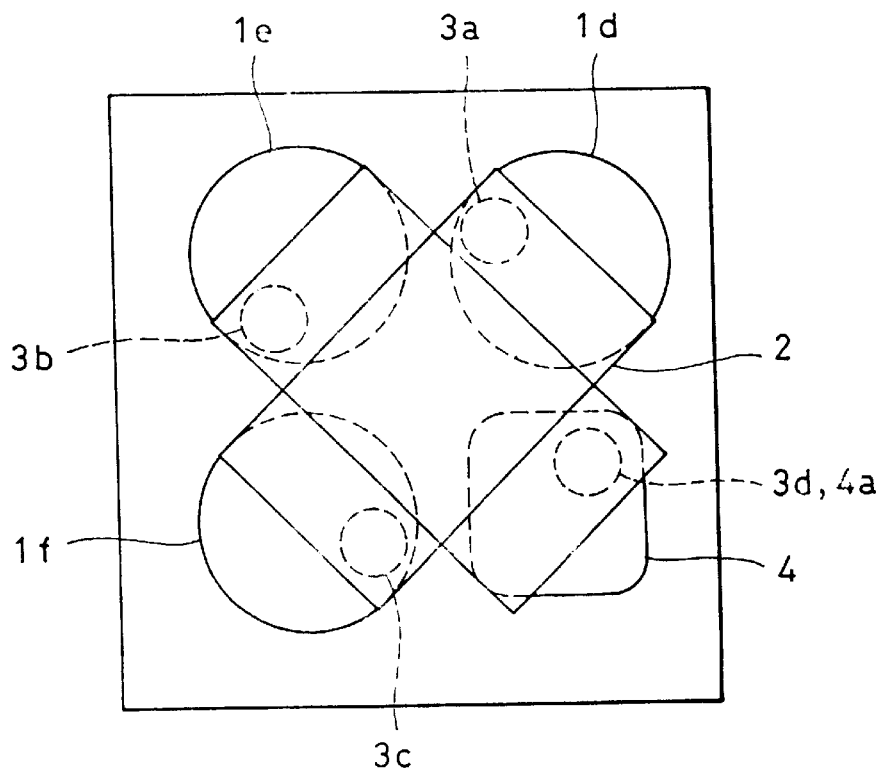
FIG. 11 is a plan view showing a still further example of construction of the conventional semiconductor wafer polishing device.

FIG. 7 is a plan view showing the construction of the fourth embodiment of the semiconductor wafer polishing device according to the present invention. In FIG. 7, the fourth embodiment of the semiconductor wafer polishing device according to the present invention is constructed with the platens 1a and 1b, the head block 2, the carries 3a to 3d, the load cups 4 (4a and 4b), the layer thickness measuring mechanism 5, the loader portion 6 and the unloader portion 7.

The fourth embodiment of the semiconductor wafer polishing device according to the present invention shows a basic construction of respective embodiments set forth above. On the head block 2, respective two and total four carriers 3a to 3d are arranged on both ends about the rotational shaft. With taking the rotational shaft as center portion, respective semiconductor wafers are moved on the platens 1a and 1b, the layer thickness measuring mechanism 5 and the load cup 4.

As set forth above, after polishing up to about 80% of the predicted value of the optimal polishing amount of the semiconductor wafer, final polishing condition is determined by actual measurement to perform final polishing according to the final polishing condition. At this time, the remaining polishing amount is about 20 percents of the overall polishing amount. Therefore, evenif about 10 percents of rate fluctuation to be caused in normal polishing is present, an error becomes about 2 percents of the total polishing amount. On the other hand, since the final polishing condition 8final polishing amount is determined on the basis of the residual layer thickness, fluctuation of deposition amount can be accommodated. Furthermore, necessary polishing amount of the semiconductor wafer with the pattern is different depending upon the pattern, by using the layer thickness measuring mechanism 5 adapted for semiconductor wafer with the pattern by image recognition, it becomes possible to adapt to difference of the necessary polishing amount. Therefore, pilot polishing conventionally required per every new mask becomes unnecessary to determine the condition during a series of polishing operation. Therefore, controllability of the residual layer can be improved significantly.

Furthermore, these polishing, measurement and polishing are performed sequentially within the same device in in-line manner, re-polishing becomes unnecessary to improve production efficiency. In contrast to this, when re-polishing is performed using different polishing device, period required for handling in washing, layer thickness measurement and polishing overlap to lower production efficiency.

As set forth above, according to the present invention, in the semiconductor wafer polishing device performing polishing of the interlayer insulation layer on the semiconductor wafer, polishing for the interlayer insulation layer is performed in dividing manner by the platen. Then, the layer thickness of the interlayer insulation layer is measured while the polishing process by the platen is performed so that the final polishing is performed depending upon the result of measurement to improve controllability of the residual layer thickness and to improve production ability.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

Namely, while the present invention has been discussed in terms of the preferred embodiments of the present invention, number of carriers and number of platens to be employed are not limited to those in the respective embodiments. Also, while the shown embodiments have been discussed in terms of the construction where the head blocks 2, 2a and 2b have rotational shafts and systems to rotate between the platens 1a to c surrounding the rotational shafts, the present invention is applicable even for the system performing divided polishing and measurement at the mid-way of division even for the system, in which the head blocks 2, 2a and 2b are moved between the platens 1a to 1c in parallel, as a matter of course.

What is claimed is:

1. A semiconductor wafer polishing device performing polishing of an interlayer insulation layer on a semiconductor wafer, comprising:

a first platen and a second platen, said first and second platens performing divided polishing for the interlayer insulation layer;

a measuring device operatively disposed between said first platen and said second platen, said measuring device operably measuring a layer thickness of said interlayer insulation layer during a polishing process by said first platen, and said second platen performing a second polishing depending upon said layer thickness; and a plurality of transporting devices for selectively moving said semiconductor wafer back and forth between said first platen and said measuring device.

2. The semiconductor wafer polishing device as set forth in claim 1, wherein said first platen is operable in a polishing amount of about 70 to 90 percent of a predicted optimal polishing amount of the interlayer insulation layer.

3. The semiconductor wafer polishing device as set forth in claim 1, further comprising a common transporting passage for selectively moving the semiconductor wafer between said first platen and said measuring device.

4. The semiconductor wafer polishing device as set forth in claim 1, wherein said first platen includes a polishing region divided into a plurality of regions, each of said plurality of regions adapted to perform a respective polishing.

5. The semiconductor wafer polishing device as set forth in claim 1, further comprising additional platens.

6. The semiconductor wafer polishing device as set forth in claim 1, further comprising a transport device for sequentially transporting the semiconductor between a position at which polishing of said interlayer insulation layer is performed and a position at which measuring a layer thickness of said interlayer insulation layer is performed.

7. The semiconductor wafer polishing device as set forth in claim 1, wherein said plurality of transporting devices are independently operable from each other.

8. The semiconductor wafer polishing device as set forth in claim 1, further comprising a transport device for transporting the semiconductor wafer along a predetermined circumference.

9. The semiconductor wafer polishing device as set forth in claim 8, wherein said transport device transports the semiconductor wafer along a predetermined angle along said predetermined circumference such that said measurement device and at least one of said first and second platens are simultaneously operable.

10. The semiconductor wafer polishing device as set forth in claim 1, further comprising a transport device for linearly moving the semiconductor wafer between a position at which polishing of said interlayer insulation layer is performed by at least one said first platen and second platen, and a position at which measuring of the layer thickness of said interlayer insulation layer is performed.

11. A semiconductor wafer polishing device for polishing an interlayer insulation layer on a semiconductor wafer comprising:

a platen for polishing of said interlayer insulation layer in a divided manner, said divided manner having an interval between polishing processes;

a layer thickness measuring unit for measuring a layer thickness of said interlayer insulation layer during said interval for performing final polishing for said interlayer insulation layer depending upon a result of measurement by said layer thickness measuring unit; and a plurality of transporting devices for selectively moving the semiconductor wafer back and forth between said platen and said layer thickness measurement unit.

12. The semiconductor wafer polishing device as set forth in claim 11, wherein said platen is operable to perform a polishing in an amount of about 70 to 90 percent of a predicted optimal polishing amount of the interlayer insulation layer.

13. The semiconductor wafer polishing device as set forth in claim 11, further comprising a common transporting passage between said platen and said layer thickness measuring unit.

14. The semiconductor wafer polishing device as set forth in claim 11, wherein said platen further comprises a polishing region on said platen divided into a plurality of regions to perform respective polishing of said interlayer insulation layer.

15. The semiconductor wafer polishing device as set forth in claim 11, further comprising a plurality of platens for performing polishing.

16. The semiconductor wafer polishing device as set forth in claim 11, further comprising a transport device sequentially transporting the semiconductor between a position at which polishing of said interlayer is performed and a position at which measuring a layer thickness of said interlayer insulation layer is performed.

17. The semiconductor wafer polishing device as set forth in claim 11, wherein said plurality of transporting devices are operable independently of each other.

18. The semiconductor wafer polishing device as set forth in claim 11, further comprising a transport device for selectively transporting the semiconductor wafer along a predetermined circumference.

19. The semiconductor wafer polishing device as set forth in claim 18, wherein polishing of said interlayer insulation layer and measurement of layer thickness of said interlayer insulation layer are performed each time the semiconductor wafer is transported for a predetermined angle along said predetermined circumference, whereby movement of said transportation device for said predetermined angle aligns the semiconductor wafer with one said platen and said measuring unit.

20. The semiconductor wafer polishing device as set forth in claim 11, wherein said semiconductor wafer is transported by linear movement between a position at which polishing of said interlayer insulation layer by said platen is performed and a position at which measuring the layer thickness of said interlayer insulation layer is performed.

21. A semiconductor wafer polishing method for polishing of an interlayer insulation layer on a semiconductor wafer comprising:

loading the semiconductor wafer into a polishing device for performing divided polishing of the interlayer insulation layer by a platen, said divided polishing having at least two polishing processes;

measuring a layer thickness of the polished interlayer insulation layer during an interval between said divided polishing;

transporting said semiconductor wafer between a position at which polishing is performed and a position at which measurement of the layer thickness of said interlayer insulation layer is performed, using a plurality of transporting devices; and performing final polishing depending upon a result of measurement before unloading the semiconductor wafer from the polishing device,
wherein said divided polishing and said measuring are alternately performed before performing said final polishing.

22. The semiconductor wafer polishing method as set forth in claim 21, wherein polishing in said polishing process in advance of said measuring is performed in a polishing amount of about 70 to 90 percent of a predicted optimal polishing amount of the interlayer insulation layer.

23. The semiconductor wafer polishing method as set forth in claim 21, wherein said divided polishing and said measuring of said layer thickness are performed on a common transporting passage.

24. The semiconductor wafer polishing method as set forth in claim 21, wherein said divided polishing utilizes a platen divided into a plurality of regions to perform polishing of said interlayer insulation layer by respective ones of said plurality of regions.

25. The semiconductor wafer polishing method as set forth in claim 21, wherein said divided polishing of said interlayer insulation layer is performed by a plurality of platens.

26. The semiconductor wafer polishing method as set forth in claim 21, wherein said semiconductor wafer is sequentially transported to a position at which polishing of said interlayer insulation layer and a position at which measuring a layer thickness of said interlayer insulation layer is performed.

27. The semiconductor wafer polishing method as set forth in claim 21, wherein said plurality of transporting devices are operable independently of each other.

28. The semiconductor wafer polishing method as set forth in claim 21, further comprising transporting said semiconductor wafer along a predetermined circumference.

29. The semiconductor wafer polishing method as set forth in claim 28, wherein said polishing of said interlayer insulation layer and said measuring of layer thickness of said interlayer insulation layer are performed after every transportation of the semiconductor wafer for a predetermined angle along said predetermined circumference.

30. The semiconductor wafer polishing method as set forth in claim 21, wherein said semiconductor wafer is transported by linear movement in a plurality of polishing and said layer thickness measurings.

31. The semiconductor wafer polishing method of claim 21, wherein the measuring of a layer thickness further comprises polishing a second semiconductor wafer simultaneously with said measuring.

32. A semiconductor wafer polishing device processing a first semiconductor wafer and a second semiconductor wafer, said first semiconductor wafer and said second semiconductor wafer having a respective first and second interlayer insulation layer, said device comprising:
a first platen for performing divided polishing for the first interlayer insulation layer; and
a measuring device for operably measuring a layer thickness of the second interlayer insulation layer while said first platen performs polishing of said first interlayer insulation layer; and
a plurality of transporting devices for selectively moving said first semiconductor wafer and said second semiconductor wafer back and forth between said first platen and said measuring device.

\* \* \* \* \*